(12) United States Patent
Nakajima et al.

(10) Patent No.: US 10,654,266 B2
(45) Date of Patent: May 19, 2020

(54) LIQUID EJECTING HEAD AND LIQUID EJECTING APPARATUS

(71) Applicant: SEIKO EPSON CORPORATION, Tokyo (JP)

(72) Inventors: Yoshinori Nakajima, Matsumoto (JP); Takahiro Kanegae, Shiojiri (JP); Hiroshige Owaki, Okaya (JP); Makoto Otsuki, Matsumoto (JP); Hironori Matsuoka, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 16/233,380

(22) Filed: Dec. 27, 2018

(65) Prior Publication Data

US 2019/0193397 A1 Jun. 27, 2019

(30) Foreign Application Priority Data

Dec. 27, 2017 (JP) .................. 2017-250936

(51) Int. Cl.
*B41J 2/045* (2006.01)
*H01L 41/053* (2006.01)
(Continued)

(52) U.S. Cl.
CPC ....... *B41J 2/04581* (2013.01); *B41J 2/14201* (2013.01); *B41J 2/14233* (2013.01); *B41J 29/02* (2013.01); *B41J 29/377* (2013.01); *H01L 41/0533* (2013.01); *B41J 2002/14241* (2013.01); *H01L 41/0973* (2013.01)

(58) Field of Classification Search
CPC ................ B41J 2/14201; B41J 2/14209; B41J 2/14233; B41J 2/14274; B41J 2/14282; B41J 2/1429; B41J 2/14298; B41J 2002/14217; B41J 2002/14225; B41J 2002/14241; B41J 2002/1425; B41J 2002/14266; B41J 2002/14306; B41J 2/04581; B41J 29/02; B41J 29/377
See application file for complete search history.

(56) References Cited

U.S. PATENT DOCUMENTS 9,016,835 B1 4/2015 Nystrom
2002/0130930 A1 9/2002 Moriya
(Continued)

FOREIGN PATENT DOCUMENTS

EP 1953839 A 8/2008
JP 4209144 B 1/2004
(Continued)

OTHER PUBLICATIONS

European Search Report issued in Application No. EP18248129 dated May 15, 2019.

*Primary Examiner* — Kristal Feggins
(74) *Attorney, Agent, or Firm* — Workman Nydegger (57) ABSTRACT

A liquid ejecting head includes a plurality of driving elements that causes an ejection of a liquid from a nozzle by causing a fluctuation in a pressure, a sealing body that seals a first space for accommodating the plurality of driving elements, a case member that forms a second space for surrounding the sealing body, an atmosphere vent that is formed in the case member and through which the second space communicates with the air, a communication hole that is formed in the sealing body and through which the first space communicates with the second space, and a moisture absorbent disposed in the second space.

20 Claims, 6 Drawing Sheets

(51) Int. Cl.
*B41J 2/14* (2006.01)
*B41J 29/02* (2006.01)
*B41J 29/377* (2006.01)
*H01L 41/09* (2006.01)

(56) References Cited

U.S. PATENT DOCUMENTS

| | | |
|---|---|---|
| 2003/0234834 A1 | 12/2003 | Nakano et al. |
| 2005/0285909 A1 | 12/2005 | Murata |
| 2007/0291083 A1 | 12/2007 | Gyoutoku |
| 2010/0220146 A1 | 9/2010 | Menzel et al. |
| 2011/0139901 A1 | 6/2011 | Menzel |
| 2015/0130876 A1 | 5/2015 | Nystrom et al. |

FOREIGN PATENT DOCUMENTS

| | | |
|---|---|---|
| JP | 2005074966 A | 3/2005 |
| JP | 2005-131888 A | 5/2005 |
| JP | 2006255973 A | 9/2006 |
| JP | 2007276184 A | 10/2007 |
| JP | 201113549 A | 7/2011 |
| JP | 2011135001 A | 7/2011 |
| JP | 2012-519095 A | 8/2012 |
| JP | 2015-093488 A | 5/2015 |
| JP | 2016-000500 A | 1/2016 |
| JP | 2017-140759 A | 8/2017 |

LIQUID EJECTING HEAD AND LIQUID EJECTING APPARATUS

CROSS REFERENCE TO RELATED APPLICATIONS

This application claims priority to Japanese Patent Application No. 2017-250936 filed on Dec. 27, 2017. The entire disclosure of Japanese Patent Application No. 2017-250936 is incorporated herein by reference.

BACKGROUND

1. Technical Field

The present invention relates to a technique for ejecting a liquid such as ink.

2. Related Art

In a liquid ejecting head that includes a plurality of liquid ejection sections that eject a liquid by changing a pressure of a pressure chamber filled with a liquid such as ink with a driving element such as a piezoelectric element, a space in which the driving element is accommodated is sealed to protect the driving element from moisture. For example, in JP-A-2016-000500, an accommodation space of the driving element is sealed by bonding a sealing plate with an adhesive to a substrate on which the accommodation space of the driving element is formed. The adhesive that protrudes during such a bonding is accommodated in an adhesive escape space portion. However, since the adhesive escape space portion communicates with the air, there is a concern that the moisture enters the accommodation space of the driving element from the adhesive escape space portion. In JP-A-2016-000500, in order that the moisture does not enter the accommodation space of the driving element from the adhesive escape space portion, an atmosphere communication path of the adhesive escape space portion is closed to block the moisture.

However, if the atmosphere communication path that communicates with the accommodation space of the driving element is closed as in JP-A-2016-000500, the accommodation space of the driving element becomes a sealed space, so that a vibration of the pressure chamber caused by driving of the driving element is propagated to the accommodation space of the driving element, and a pressure fluctuation occurs in the accommodation space of the driving element as well. Since each pressure chamber is also affected by the pressure fluctuation of the accommodation space of the driving element, there is a concern that an ejection characteristic changes due to the pressure fluctuation of the accommodation space of the driving element. Further, the pressure fluctuation of the accommodation space of the driving element also changes depending on the number of the driving element to be driven, so that a difference is generated in the pressure fluctuation gap. Therefore, there is a concern that the ejection characteristic changes depending on the number of the driving elements to be driven.

SUMMARY

An advantage of some aspects of the invention is that the driving element is protected from the moisture while the pressure fluctuation in the space that accommodates the driving element is suppressed.

According to an aspect of the invention, there is provided a liquid ejecting head that includes a plurality of driving elements that causes a liquid to be ejected from a nozzle by fluctuating a pressure, a sealing body that forms a first space for accommodating the plurality of driving elements, a case member that forms a second space for surrounding the sealing body, an atmosphere vent that is formed in the case member and through which the second space communicates with atmosphere, a communication hole that is formed in the sealing body and through which the first space communicates with the second space, and a moisture absorbent in the second space. With this configuration, since the first space for accommodating the driving element communicates through a communication hole with the second space that communicates with atmosphere, the first space can be prevented from becoming a sealed space. Therefore, the fluctuation of the pressure in the accommodation space caused by the vibration of the pressure chamber can be suppressed. Further, since the moisture absorbent is disposed in the second space, even if the moisture enters the second space from the atmosphere vent, the moisture is absorbed by the moisture absorbent in the second space. Therefore, since the moisture entering the first space through the communication hole can be reduced, the driving element can be protected from moisture. With this configuration, the driving element can be protected from the moisture while the pressure fluctuation of the space for accommodating the driving element is suppressed.

In the liquid ejecting head, the moisture absorbent may be in a position closer to the communication hole than to the atmosphere vent. With this configuration, since the moisture absorbent is in a position closer to the communication hole than to the atmosphere vent, compared with a case where the moisture absorbent is in a position close to the atmosphere vent, it is possible to suppress suction of the moisture outside the second space from the atmosphere vent and absorption of the moisture. Therefore, the time during which hygroscopic capacity of the moisture absorbent can be maintained can be extended. Further, since the moisture absorbent is in a position close to the communication hole, compared with a case where the moisture absorbent is in a position away from the communication hole, it is possible to make it difficult for the moisture to enter from the communication hole.

In the liquid ejecting head, the atmosphere vent may be in a position higher than the communication hole in a vertical direction, and the moisture absorbent may be disposed between the atmosphere vent and the communication hole in the vertical direction. With this configuration, the water component of the moisture that entered the second space from the atmosphere vent can condense between the atmosphere vent and the communication hole due to a temperature drop and a dew condensation droplet may adhere to an inner circumferential surface of the case member. Then, there is a concern that the dew condensation droplet evaporates and the moisture increases when a temperature rises again thereafter. However, since the water component rises in the vertical direction as the dew condensation droplet evaporates, the moisture absorbent disposed between the atmosphere vent and the communication hole can absorb the moisture efficiently. Therefore, even when the dew condensation droplet evaporates on the inner circumferential surface of the case member, entry of the moisture into the communication hole can be suppressed.

In the liquid ejecting head, the second space may include a recess portion that has a bottom surface positioned lower than the communication hole in the vertical direction. With this configuration, the dew condensation droplet adhering to the inner circumferential surface of the case member can be trapped in a recess portion of the second space even if the droplet moves downward along the inner circumferential surface of the case member. Further, since the recess portion has the bottom surface positioned lower than communication hole in the vertical direction, the dew condensation droplet can be kept in the recess portion positioned lower than the communication hole, and thus, entry of the dew condensation droplet into the communication hole can be suppressed.

In the liquid ejecting head, the case member may have a higher thermal conductivity than the sealing body. With this configuration, since the case member has a higher thermal conductivity than the sealing body, when a temperature falls, the water component of the moisture that entered the second space can be condensed actively on the inner circumferential surface of the case member in the second space. Therefore, since the moisture of the first space can be lowered, the dew condensation can be made difficult in the first space. Further, when a temperature rises, the dew condensation droplet condensed on the inner circumferential surface of case member evaporates again in the second space, so that the moisture is absorbed by the moisture absorbent easily.

In the liquid ejecting head, the case member may include at least a lower case member and an upper case member which is positioned at higher than the lower case member in the vertical direction, the moisture absorbent may be disposed in the upper case member, and the lower case member may have a higher thermal conductivity than the upper case member. With this configuration, since the lower case member constituting the case member has higher thermal conductivity than the upper case member, when a temperature falls, the water component of the moisture that entered the second space can condense more easily on the lower case member than the upper case member. Therefore, when a temperature rises, the dew condensation droplet adhering to the lower case member evaporates again and rises up, so that the moisture is absorbed by the moisture absorbent disposed in the upper case member easily.

In the liquid ejecting head, a minimum opening area of the communication hole may be smaller than a minimum opening area of the atmosphere vent. With this configuration, since the minimum opening area of the communication hole is smaller than the minimum opening area of the atmosphere vent, it is difficult for the moisture that entered the second space from the atmosphere vent to enter the first space from the communication hole.

In the liquid ejecting head, a volume of the first space may be smaller than a volume of the second space. With this configuration, since the volume of the first space is smaller than the volume of the second space, even if the condensation occurs, the dew condensation volume in the first space can be made smaller than the dew condensation volume in the second space. Therefore, the characteristic deterioration of the driving element caused by the dew condensation can be reduced. Conversely, with this configuration, since the volume of the second space is larger than the volume of the first space, the moisture absorbent disposed in the second space is increased easily, and thus, the hygroscopic effect by the moisture absorbent can be enhanced.

In the liquid ejecting head, a circuit substrate may be disposed in the second space. With this configuration, since the circuit substrate that can become a heat generation source is disposed in the second space, the temperature of the second space rises more easily than the temperature of the first space, and thus, the permissible volume of the saturation water vapor in the second space increases, and thus, the evaporation volume of the water component increases easily. In this respect, since the moisture absorbent is present in the second space in which the circuit substrate, the ambient temperature of which rises easily, is disposed, the moisture of the second space in which the evaporation volume of the water component increases easily can be absorbed efficiently.

In the liquid ejecting head, a plurality of sealing bodies may be provided, the communication holes may be provided corresponding to each sealing body, and the first space of each of the sealing bodies may communicate with the second space with each other through each of the communication holes. With this configuration, since the moisture absorbent disposed in the second space makes it possible to suppress entry of the moisture into each of the first space from each communication hole, compared with the case where the second space is provided for each of the first space and the moisture absorbent is disposed in each of the second space, structure of the case member can be simplified. Further, since the second space is a common communication space for each of the first space, compared with the case where the second space is provided for each of the first space, the volume of the second space can be expanded considerably. Therefore, since the moisture absorbent disposed in the second space is increased easily, the hygroscopic effect of the moisture absorbent can be enhanced.

According to another aspect of the invention, there is provided a liquid ejecting apparatus that includes the liquid ejecting head described above. With this configuration, the liquid ejecting apparatus that includes the liquid ejecting head that can protect the driving element from the moisture while suppressing the pressure fluctuation of the space that accommodates the driving element can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

Figure 1:
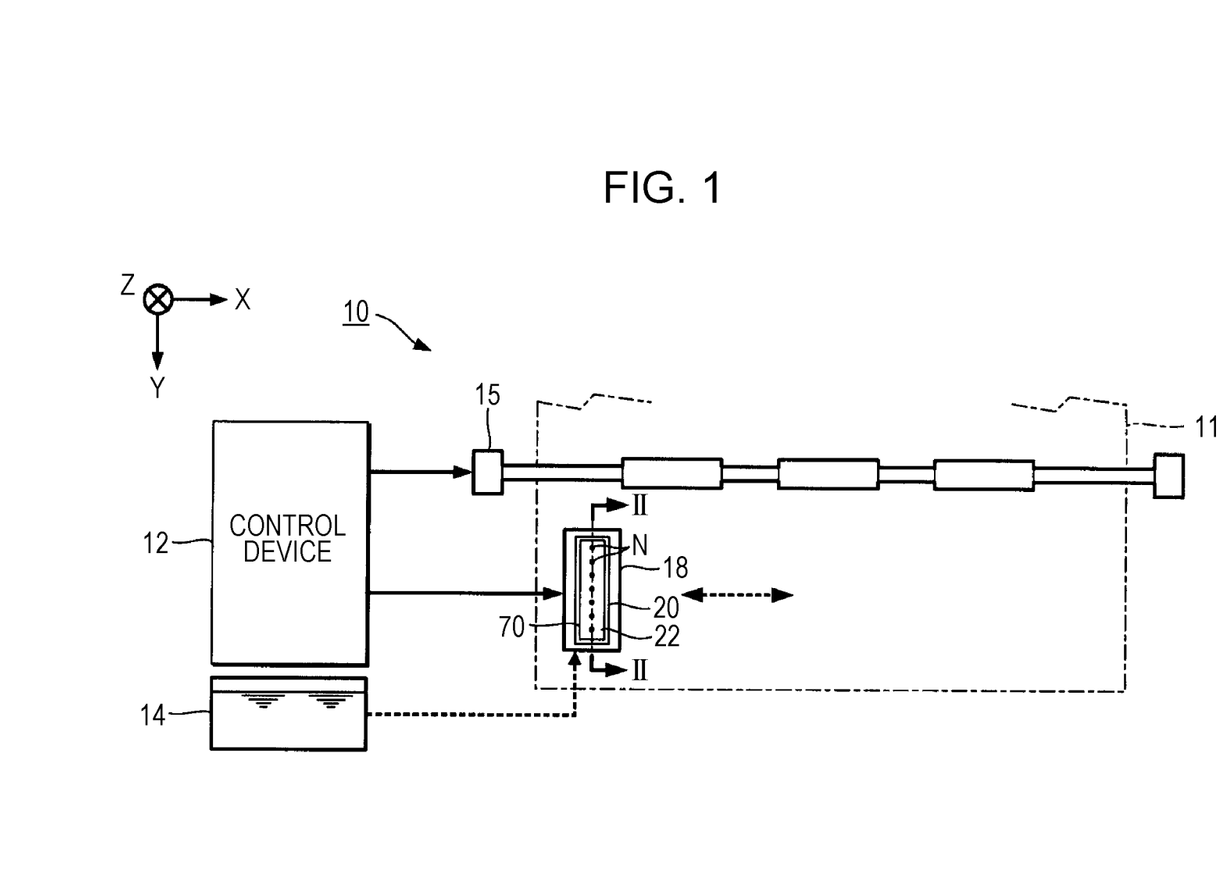
FIG. 1 is a view showing a configuration of a liquid ejecting apparatus according to a first embodiment of the invention.

FIG. 1 shows a first embodiment of the invention, in which a partial configuration of the liquid ejecting apparatus 10 is illustrated. The liquid ejecting apparatus 10 of the first embodiment is an ink jet type printing apparatus that ejects ink, an example of a liquid, onto a medium 11 such as printing paper and the like. The liquid ejecting apparatus 10 shown in FIG. 1 includes a control device (controller) 12, a transport mechanism 15, a carriage 18, and a liquid ejecting head 20. A liquid container 14 that stores ink is mounted on the liquid ejecting apparatus 10.

The liquid container 14 is an ink tank type cartridge made of a box-shaped container attachable to and detachable from the main body of the liquid ejecting apparatus 10. The liquid container 14 is not limited to a box-shaped container and may be an ink pack type cartridge made of a sack-shaped container. In the liquid container 14, ink is stored. The ink may be black ink or may be color ink. The ink stored in the liquid container 14 is pressure-fed to the liquid ejecting head 20.

The control device 12 comprehensively controls each element of the liquid ejecting apparatus 10. For example, the control device 12 controls operation of ejecting liquid from the liquid ejecting head 20. The transport mechanism 15 transports the medium 11 in the Y-direction under the control of the control device 12. The liquid ejecting head 20 ejects ink supplied from the liquid container 14 onto the medium 11 from each of a plurality of the nozzles N under the control of the control device 12.

The liquid ejecting head 20 is mounted on the carriage 18. In FIG. 1, a case where one liquid ejecting head 20 is mounted on the carriage 18 is presented as an example, but the invention is not limited thereto. A plurality of the liquid ejecting heads 20 may be mounted on the carriage 18. The control device 12 causes the carriage 18 to reciprocate in the X-direction which intersects with Y-direction (orthogonal in FIG. 1). A desired image is formed on the surface of the medium 11 by ejecting ink from the liquid ejecting head 20 onto the medium 11 in concurrence with a repetition of the transport of the medium 11 and the reciprocation of the carriage 18. A plurality of the liquid ejecting heads 20 may be mounted on the carriage 18.

In the liquid ejecting head 20, a liquid ejection section 70 is mounted. In the liquid ejection section 70, a nozzle row is disposed. The nozzle row is a collection of a plurality of nozzles N arranged in a straight line in the Y-direction. The ink supplied from the liquid container 14 is ejected from each nozzle N. The nozzle N of each nozzle row is formed on an ejection surface 22 (the surface facing the medium 11) of the liquid ejecting head 20. Further, the number and arrangement of the liquid ejection section 70 and the nozzle row are not limited to the example. For example, it is also possible to arrange a plurality of nozzle rows in a zigzag or staggered pattern on the ejection surface 22 of the liquid ejecting head 20. The direction perpendicular to the X-Y plane (a plane parallel to the surface of medium 11) is denoted as the Z-direction.

Figure 2:
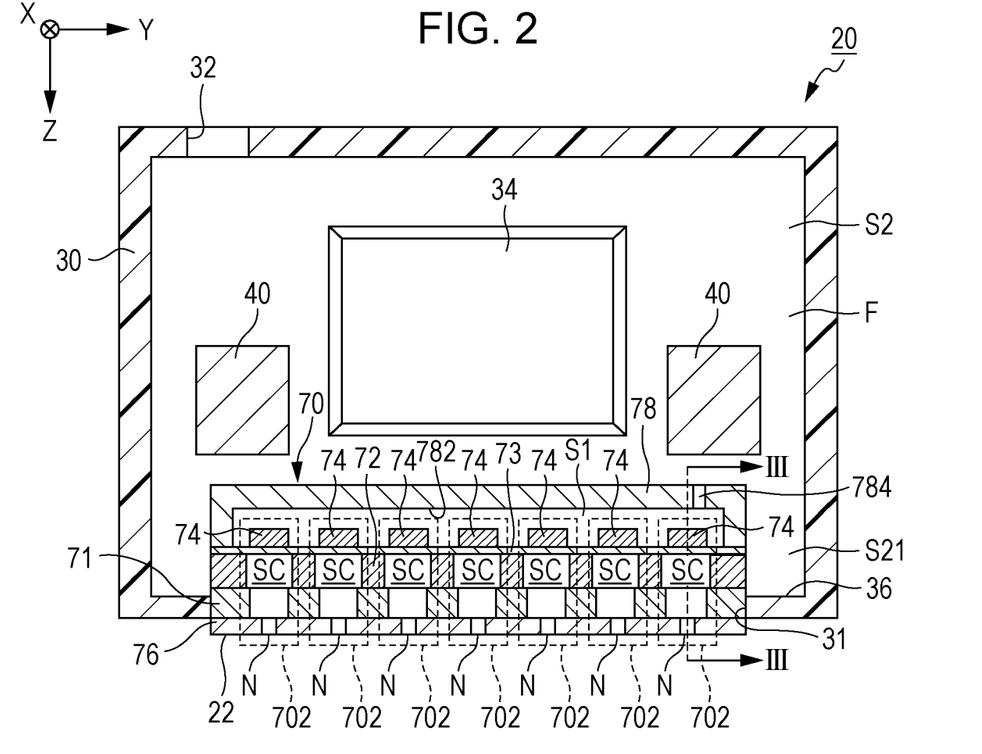
FIG. 2 is a sectional view taken along the line II-II of a liquid ejecting head shown in FIG. 1.

FIG. 2 shows a sectional view of the liquid ejecting head 20 shown in FIG. 1 taken along the line II-II. As shown in FIG. 2, the liquid ejecting head 20 includes the liquid ejection section 70 and the case member 30. The liquid ejection section 70 is accommodated in the case member 30. Specifically, an opening section 31 is formed on the positive side (downward in FIG. 2) of the Z-direction of the case member 30. The liquid ejection section 70 is fixed to the case member 30 so that the ejection surface 22 is exposed from the opening section 31. The liquid ejection section 70 includes the ejection section 702 corresponding to each nozzle N.

Figure 3:
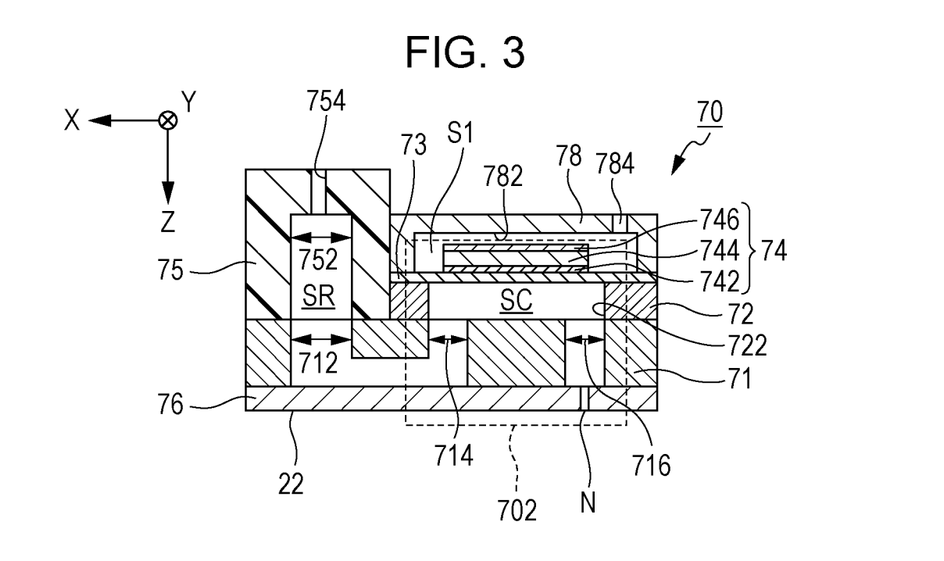
FIG. 3 is a sectional view taken along the line III-III of the liquid ejection section shown in FIG. 2.

FIG. 3 shows a sectional view of the liquid ejection section 70 with a focus on one random ejection section 702. The liquid ejection section 70 shown in FIG. 3 is a structure in which the pressure chamber substrate 72, the diaphragm 73, the piezoelectric element 74, and the support body 75 are disposed on one side of the flow path substrate 71 while the nozzle plate 76 is disposed on the other side thereof. The flow path substrate 71, the pressure chamber substrate 72, and the nozzle plate 76 are formed of a flat plate material of silicon for example, and the support body 75 is formed of a resin material by injection molding for example. The pressure chamber substrate 72 and diaphragm 73 may be provided integrally as in a case where a part of a member constituting the pressure chamber substrate 72 is thinned to function as the diaphragm 73. A plurality of the nozzles N are formed on the nozzle plate 76. In the configuration of FIG. 3, the surface of the nozzle plate 76 facing the medium 11 constitutes the ejection surface 22 of the liquid ejecting head 20.

On the flow path substrate 71, the opening section 712, the branch flow path 714, and the communication flow path 716 are formed. The branch flow path 714 and the communication flow path 716 are through holes formed for each nozzle N, and the opening section 712 is a continuous opening for a plurality of the nozzles N. The space in which the accommodation section 752 (recess portion) formed on the support body 75 and the opening section 712 of the flow path substrate 71 communicate with each other functions as the common liquid chamber SR (reservoir) that stores the ink supplied from the liquid container 14 through the introduction flow path 754 of the support body 75.

On the pressure chamber substrate 72, the opening section 722 is formed for each nozzle N. The diaphragm 73 is an elastically deformable plate material disposed on the surface of the pressure chamber substrate 72, which is an opposite side to the flow path substrate 71. Space pinched between the diaphragm 73 and the flow path substrate 71 inside each opening section 722 of the pressure chamber substrate 72 functions as the pressure chamber SC (cavity) which is filled with ink supplied from the common liquid chamber SR through the branch flow path 714. Each pressure chamber SC communicates with the nozzle N through the communication flow path 716 of the flow path substrate 71.

On the surface of the diaphragm 73, opposite to the pressure chamber substrate 72, the piezoelectric element 74 is formed for each nozzle N. Each piezoelectric element 74 is a driving element in which the piezoelectric body 744 is interposed between the first electrode 742 and the second electrode 746. A driving signal is supplied to either one of the first electrode 742 and the second electrode 746, and a predetermined reference potential is supplied to the other. When the diaphragm 73 vibrates due to deformation of the piezoelectric element 74 by the supply of the driving signal, pressure in the pressure chamber SC fluctuates and the ink in the pressure chamber SC is ejected from the nozzle N. Specifically, the ink is ejected from the nozzle N in the amount that corresponds to the amplitude of the driving signal. One ejection section 702 shown in FIG. 3 is a portion that includes the piezoelectric element 74, the diaphragm 73, the pressure chamber SC, and the nozzle N. The configuration of the piezoelectric element 74 is not limited to the above description.

As shown in FIGS. 2 and 3, to protect the piezoelectric element 74 and the diaphragm 73 from moisture, each of the piezoelectric element 74 and the diaphragm 73 is accommodated in the first space S1 (accommodation space), and the first space S1 is sealed with the sealing body 78. The sealing body 78 according to the embodiment is a plate-shaped member having a recess portion 782 formed on the positive side in the Z-direction and is bonded to the diaphragm 73 with an adhesive or the like. The first space S1 is a space surrounded by the recess portion 782 of the sealing body 78 and the diaphragm 73. The internal space of the case member 30 functions as the second space S2 surrounding the sealing body 78.

Meanwhile, if the first space S1 that accommodates the piezoelectric element 74 and the diaphragm 73 communicates with the air, the moisture enters the first space S1 easily. When the moisture enters the first space S1 and the piezoelectric element 74 is exposed to the humid environment for a long period of time, there is also a concern that the first electrode 742 and the second electrode 746 of the piezoelectric element 74 corrode, or that the strength declines and cracking occurs due to a hydrolysis. Further, there is a concern that, if the diaphragm 73 is exposed to the highly humid environment for a long period of time, the strength of the diaphragm 73 also deteriorates and cracking occurs due to a hydrolysis. However, if the first space S1 is made a sealed space that does not communicate with atmosphere to prevent the moisture from entering the first space S1, a vibration of pressure chamber SC caused by driving of the piezoelectric element 74 is propagated to the first space S1 and a pressure fluctuation also occurs in the first space S1. Since each pressure chamber SC is also affected by the pressure fluctuation of the first space S1, there is a concern that the ejection characteristic changes due to the pressure fluctuation of the first space S1 caused by such a structural crosstalk. The pressure fluctuation of the first space S1 also changes depending on the number of the piezoelectric element 74 to be driven, causing a large difference in the pressure fluctuation gap, so that there is a concern that the ejection characteristic changes depending on the number of the piezoelectric element 74 to be driven.

Therefore, in the embodiment, as shown in FIG. 2, while the atmosphere vent 32 through which the second space S2 communicates with atmosphere is formed in the case member 30, the communication hole 784 through which the first space S1 communicates with the second space S2 is formed in the sealing body 78, and the moisture absorbent 40 is disposed in the second space S2.

In the configuration of FIG. 2, a case where the two moisture absorbents 40 are disposed apart from each other in the Y-direction on a positive side surface in the X-direction of the inner circumferential surface F (inner wall surface in the vertical direction in FIG. 2) of the case member 30 is presented as an example. However, the number of the moisture absorbent 40 may be one, or three or more. Further, in the configuration of FIG. 2, since the circuit substrate 34 that drives the piezoelectric element 74 on a positive side surface in the X-direction of the inner circumferential surface F of the case member 30 is disposed, the moisture absorbent 40 is disposed on each side of the Y-direction across the circuit substrate 34 one by one. According to such a configuration, the piezoelectric element 74 and the diaphragm 73 can be protected from the moisture while the pressure fluctuation of the first space S1 that accommodates the piezoelectric element 74 is suppressed.

Figure 4:
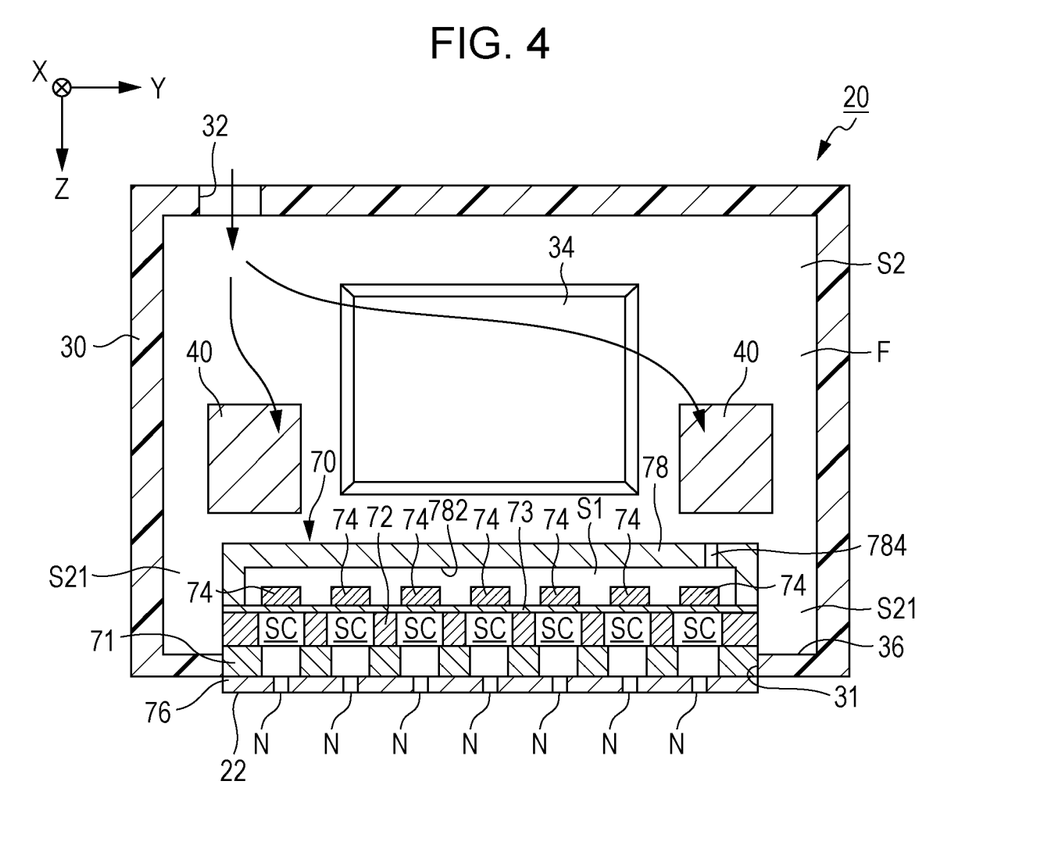
FIG. 4 is a descriptive view showing an operation of the liquid ejecting head of the embodiment.
Figure 5:
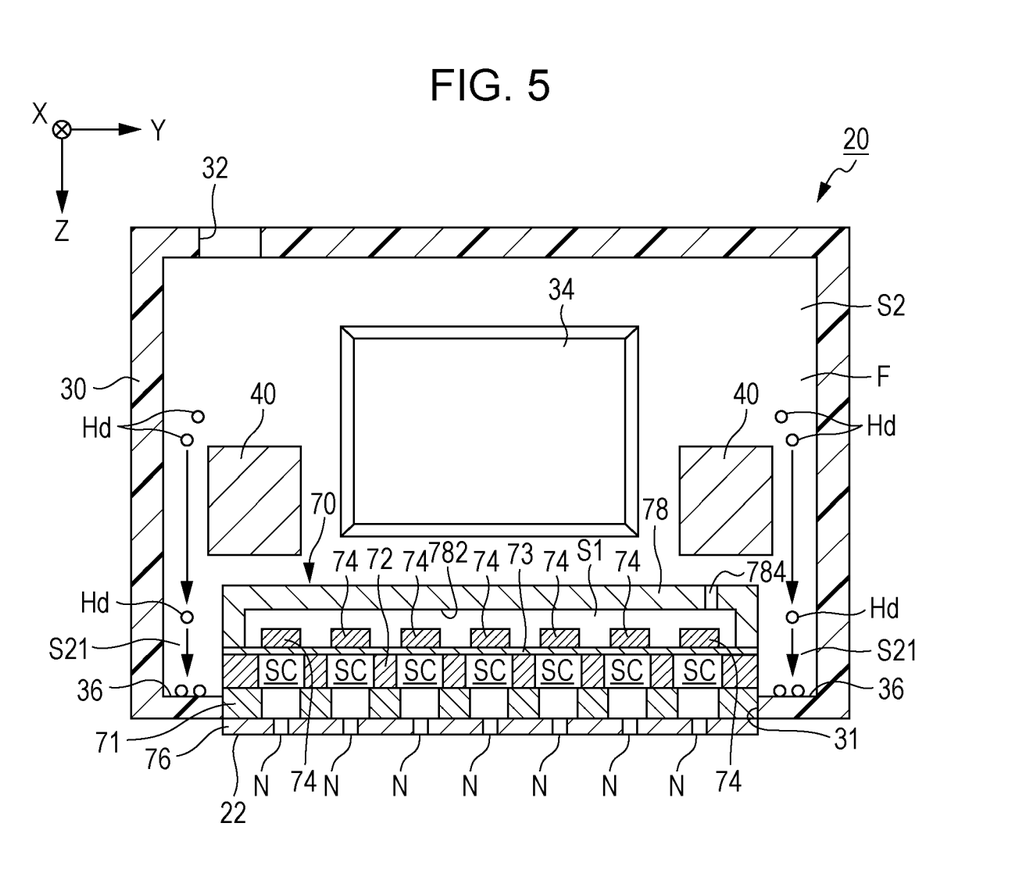
FIG. 5 is a descriptive view showing an operation of the liquid ejecting head of the embodiment.

Hereinafter, an operational effect according to the embodiment will be described with reference to the figures. FIGS. 4 and 5 show an embodiment of the liquid ejecting head 20 showing an operation thereof. FIG. 4 shows a flow of the moisture that entered the second space S2 from the atmosphere vent 32 with an arrow. FIG. 5 shows a case where the water component of the moisture that entered the second space S2 from the atmosphere vent 32 condenses to adhere to the inner circumferential surface F of the case member 30.

In the liquid ejecting head 20 according to the embodiment, since the first space S1 that accommodates the piezoelectric element 74 communicates through the communication hole 784 with the second space S2 that communicates with the air, the first space S1 can be prevented from becoming a sealed space. Therefore, since a fluctuation in pressure of the first space S1 that accommodates the piezoelectric element 74 caused by the vibration of the pressure chamber SC can be suppressed, an ejection failure caused by the structural crosstalk can be reduced. Further, since the moisture absorbent 40 is disposed in the second space S2, even if the moisture enters the second space S2 from the atmosphere vent 32 as shown in FIG. 4, the moisture is absorbed by the moisture absorbent 40 in the second space S2. Therefore, since the moisture entering the first space S1 through the communication hole 784 can be reduced, the piezoelectric element 74 and the diaphragm 73 can be protected from moisture. With this configuration, the piezoelectric element 74 and the diaphragm 73 can be protected from the moisture while the pressure fluctuation of the first space S1 that accommodates piezoelectric element 74 is suppressed.

Further, as shown in FIG. 2, according to the embodiment, since the opening area (sectional area orthogonal to Z-direction) of the communication hole 784 is smaller than the opening area (sectional area orthogonal to Z-direction) of the atmosphere vent 32, it is difficult for the moisture that entered the second space S2 from the atmosphere vent 32 to enter the first space S1 from the communication hole 784. The opening area of the communication hole 784 may be of any size such that the pressure vibration of the first space S1 can be suppressed at least to the extent that the first space S1 is not affected by the crosstalk described above. Further, a case where the communication hole 784 and the atmosphere vent 32 according to the embodiment are composed of the straight type openings is presented as an example, but the invention is not limited thereto. The communication hole 784 and the atmosphere vent 32 may be openings that include an expanding diameter section or a shrinking diameter section in a taper-shaped form. In this case, by setting the minimum opening area of communication hole 784 smaller than the minimum opening area of the atmosphere vent 32, it is possible to make it difficult for the moisture that entered the second space S2 from the atmosphere vent 32 to enter the first space S1 from communication hole 784.

According to the embodiment, each of the two moisture absorbents 40 is composed of the A-type silica gel that can maintain a stable absorption of the moisture even at a low temperature. However, the moisture absorbent 40 may be anything that can absorb the moisture that entered the second space S2. According to the embodiment, the moisture absorbent 40 composed of the A-type silica gel can absorb the moisture effectively even in an environment of low temperature. The moisture absorbent 40 may be composed of the B-type silica gel or other the moisture absorbing materials.

Further, out of the two moisture absorbents 40, one may be composed of the A-type silica gel and the other may be composed of a gas absorbent. The gas absorbent has higher absorption capacity than A-type silica gel and the like. Therefore, it is possible to absorb sulfur-based gas, chlorine-based gas and the like as well as the moisture that entered the second space S2 from the atmosphere vent 32. There is a concern that sulfur-based gas, chlorine-based gas, and the like corrode the electrical connection section, the first electrode 742 and the second electrode 746 of the piezoelectric element 74, and the like in the case member 30. According to the embodiment, since the sulfur-based gas and the chlorine-based gas are absorbed in the second space S2, the entry thereof into the first space S1 from the communication hole 784 can be suppressed. Therefore, the piezoelectric element 74 can be protected from the sulfur-based gas and the chlorine-based gas that entered from the atmosphere vent 32.

Further, as shown in FIG. 2, according to the embodiment, since the moisture absorbent 40 is in a position closer to the communication hole 784 than the atmosphere vent 32, compared with a case where the moisture absorbent 40 is in a position close to the atmosphere vent 32, it is possible to suppress suction of the moisture outside the second space S2 from the atmosphere vent 32 and absorption of the moisture. Therefore, the time during which hygroscopic capacity of the moisture absorbent 40 can be maintained can be extended. Further, since the moisture absorbent 40 is in a position close to the communication hole 784, compared with a case where the moisture absorbent 40 is in a position away from the communication hole 784, it is possible to make it difficult for the moisture to enter from communication hole 784.

Further, according to the embodiment, the atmosphere vent 32 is in a position higher than the communication hole 784 in the vertical direction (Z-direction), and the moisture absorbent 40 is disposed between the atmosphere vent 32 and the communication hole 784 in the vertical direction. With this configuration, as shown in FIG. 5, the water component of the moisture that entered the second space S2 from the atmosphere vent 32 condenses between the atmosphere vent 32 and the communication hole 784 due to a temperature drop, and the dew condensation droplet Hd adheres to the inner circumferential surface F of the case member 30 in some cases. Then, there is a concern that the dew condensation droplet Hd evaporates to raise the moisture high when the temperature rises again thereafter. However, when the dew condensation droplet Hd evaporates, the water component rises up in the vertical direction (wavy arrow line of FIG. 6), so that the moisture can be absorbed efficiently by the moisture absorbent 40 disposed between the atmosphere vent 32 and the communication hole 784. Therefore, even if the dew condensation droplet Hd evaporates on the inner circumferential surface F of the case member 30, entry of the moisture into communication hole 784 can be suppressed so that the reliability of the apparatus even in the highly humid environment can be maintained.

Further, as shown in FIG. 5, according to the embodiment, the second space S2 includes the recess portion S21 that includes the bottom surface 36 positioned lower than the communication hole 784 in the vertical direction. The recess portion S21 of FIG. 5, disposed around the liquid ejection section 70, is a ring-shaped groove surrounded by the outer circumferential surface (the surface in Z-direction) of liquid ejection section 70, a part of the inner circumferential surface F of the case member 30 that faces the outer circumference surface of the liquid ejection section 70, and the bottom surface 36. With this configuration, as shown in FIG. 5, the second space S2 can trap the dew condensation droplet Hd in the recess portion S21 even if the dew condensation droplet Hd adhering to the inner circumferential surface F of the case member 30 moves downward along the inner circumferential surface of the case member 30. Further, since the recess portion S21 has the bottom surface 36 positioned lower than the communication hole 784 in the vertical direction, the dew condensation droplet Hd can be stored in the recess portion S21 positioned lower than the communication hole 784, and thus, entry of the dew condensation droplet Hd into the communication hole 784 can be suppressed. Further, the shape of the recess portion S21 may not be annular. Further, the position of the recess portion S21 is not limited to the circumference of the liquid ejection section 70.

According to the embodiment, the material of the case member 30 has higher thermal conductivity than the sealing body 78. With this configuration, when a temperature falls, the water component of the moisture that entered the second space S2 can be condensed actively on the inner circumferential surface F of the case member 30 in the second space S2. Therefore, since the moisture of the first space S1 can be lowered, the dew condensation can be made difficult in the first space S1. Further, when a temperature rises, the dew condensation droplet Hd condensed on the inner circumferential surface F of the case member 30 evaporates again in the second space S2, so that the moisture is absorbed by the moisture absorbent 40 easily. Further, the case member 30 may be made of a resin material, so that a coating layer that suppresses permeation of the water component may be formed on the inner circumferential surface F. As for the coating layer, a material that easily condenses moisture, for example, a moisture-proof coating material like Fluorosurf (registered trademark of Fluoro Technology Co., Ltd.) and the like, may be considered. With this configuration, the case member 30 that can actively condense the moisture on the inner circumferential surface F of the case member 30 can be manufactured at low cost.

Further, as shown in FIG. 2, according to the embodiment, the circuit substrate 34 that can be a heat source is disposed in the second space S2, so that the temperature of the second space S2 rises more easily than the temperature of the first space S1, and thus, the permissible volume of the saturated water component in the second space S2 increases, and the evaporation volume of the water component increases easily. According to the embodiment, since the moisture absorbent 40 is present in the second space S2 where the circuit substrate 34 of which the ambient temperature rises easily is disposed, the moisture of the second space S2, where the evaporation volume of the water component increases easily, can be absorbed efficiently.

Further, according to the embodiment, the volume of the first space S1 is smaller than the volume of the second space S2. For example, the volume of the first space S1 is 1 to $10=^3$, while the volume of the second space S2 is 10,000 to $400,000=^3$. In this way, the smaller the volume of the first space S1 with respect to the volume of the second space S2, the smaller the dew condensation amount in the first space S1 can be made considerably than the dew condensation amount in the second space S2 even if dew condensation occurs. Therefore, the characteristic deterioration of the piezoelectric element 74 caused by the dew condensation can be reduced. Conversely, since the volume of the second space S2 is larger than the volume of the first space S1, the moisture absorbent 40 disposed in the second space S2 is increased easily, and thus, the hygroscopic effect by the moisture absorbent 40 can be enhanced.

Figure 6:
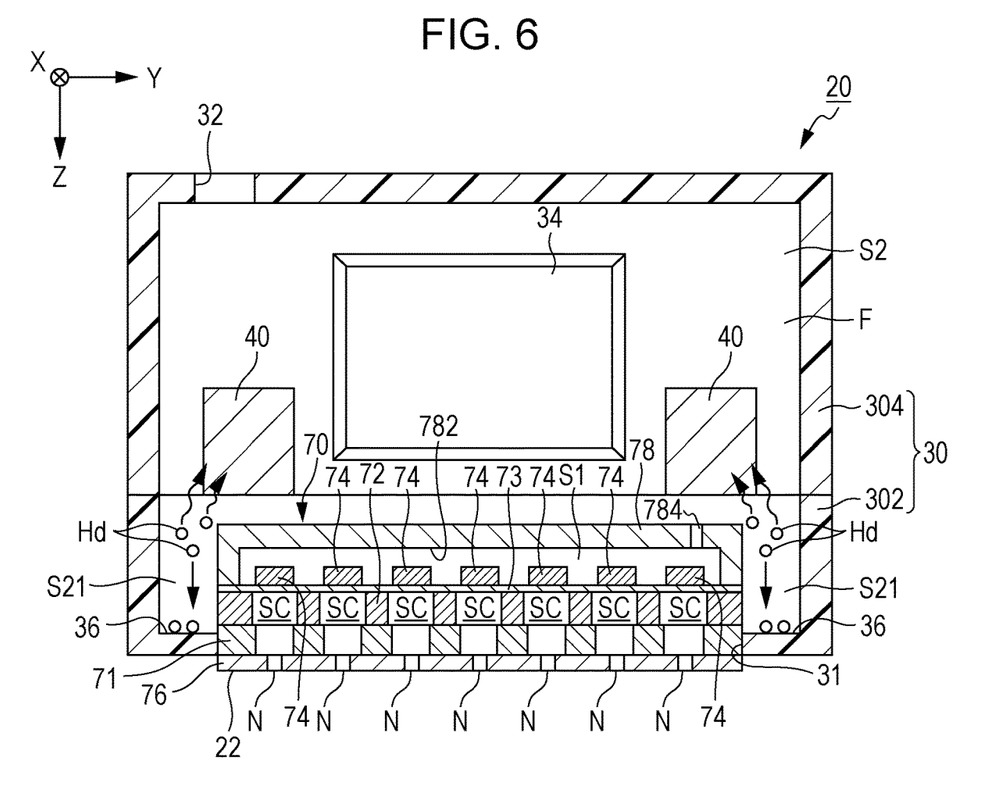
FIG. 6 is a sectional view showing a configuration of the liquid ejecting head according to a modification example of the first embodiment.

FIG. 6 shows a sectional view of the configuration of the liquid ejecting head 20 according to a modification example of the first embodiment and corresponds to FIG. 2. The case member 30 of FIG. 6 includes the lower case member 302 on the lower side in the vertical direction and the upper case member 304 on an upper side higher than the lower case member 302 in the vertical direction. The lower case member 302 and the upper case member 304 are bonded together with an adhesive or the like. The moisture absorbent 40 in FIG. 6 is disposed on the upper case member 304, and the lower case member 302 has a higher thermal conductivity than the upper case member 304.

According to the configuration of FIG. 6, since the lower case member 302 that constitutes the case member 30 has a higher thermal conductivity than the upper case member 304, when a temperature falls, the water component of the moisture that entered the second space S2 can condense more easily in the lower case member 302 than the upper case member 304. Therefore, when a temperature rises, the dew condensation droplet Hd adhering to the lower case member 302 evaporates again to rise up and is absorbed easily by the moisture absorbent 40 disposed in the upper case member 304 (wavy arrow line in FIG. 6). Further, the dew condensation droplet Hd that moves downward along the inner circumferential surface F of the lower case member 302 is trapped easily in the recess portion S21 (straight arrow line in FIG. 6). Further, in FIG. 6, a case where the lower case member 302 and the upper case member 304 are bonded together is presented as an example, but the invention is not limited thereto. For example, another member (for example, a sealing member for sealing the second space S2) may be interposed between the lower case member 302 and the upper case member 304.

Second Embodiment

A second embodiment of the invention will be described. For the element that has the same operation and function as in the first embodiment in each form presented below, reference numerals used in the description of the first embodiment will be used and the detailed description thereof will be omitted as deemed appropriate. In the second embodiment, the liquid ejecting head 20 that includes a plurality of the liquid ejection sections 70 will be presented as an example.

Figure 7:
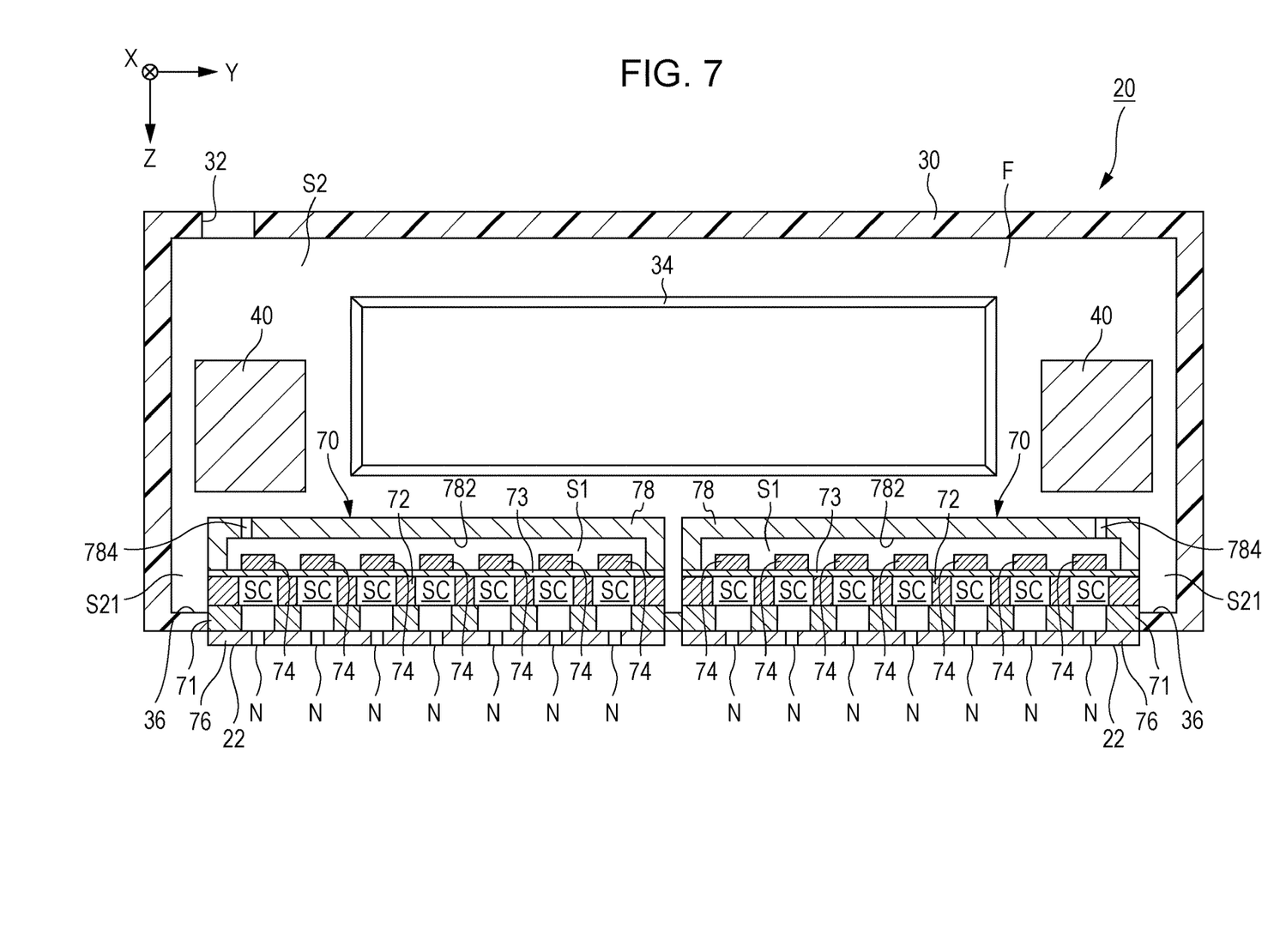
FIG. 7 is a sectional view showing a configuration of the liquid ejecting head according to a second embodiment.

FIG. 7 shows a sectional view of the configuration of liquid ejecting head 20 according to the second embodiment and corresponds to FIG. 2. The liquid ejecting head 20 of FIG. 7 includes the two liquid ejection sections 70 in the second space S2. In FIG. 7, a case where the two liquid ejection sections 70 are arranged side by side in the Y-direction is presented as an example, but a plurality of the liquid ejection sections 70 may be arranged in a zigzag manner. The communication hole 784 of FIG. 7 is provided corresponding to each of the first spaces S1, and each of the first spaces S1 communicates with the second space S2. The moisture absorbent 40 of FIG. 7 is present in the second space S2, and one moisture absorbent 40 is provided in the vicinity of each of the communication hole 784.

In the liquid ejecting head 20 of the second embodiment with such a configuration, since entry of the moisture into each of the first space S1 from each of the communication holes 784 can be suppressed by the moisture absorbent 40 disposed in the second space S2, compared with the case where the second space S2 is provided for each of the first space S1 and the moisture absorbent is disposed in each of the second space S2, the structure of the case member 30 can be simplified. Further, since the second space S2 becomes a common communication space to each of the first space S1, compared with the case where the second space S2 is provided for each of the first space S1, the volume of the second space S2 can be enlarged considerably. Therefore, the hygroscopic effect of the moisture absorbent 40 can be enhanced by increasing the moisture absorbent 40 disposed in the second space S2 easily.

Modification Example

The aspects and the embodiments described above can be modified variously. Specific modifications of aspects are presented below. Two or more aspects randomly selected from the aspects presented below and described above can be properly merged within a scope where the aspects do not contradict one another.

(1) In the embodiment described above, a serial head that causes the carriage 18 on which the liquid ejecting head 20 is mounted to reciprocate repeatedly in X-direction is presented as an example. However, the invention is also applicable to a line head in which the liquid ejecting heads 20 are arranged over the entire width of medium 11.

(2) In the embodiment described above, the liquid ejecting head 20 of the piezoelectric type using the piezoelectric element that applies a mechanical vibration to the pressure chamber is presented as an example. However, it is also possible to adopt a thermal type liquid ejecting head using a heat generating element that generates the air bubbles inside the pressure chamber by heating.

(3) The liquid ejecting apparatus 10 exemplified by the embodiment described above can be adopted in various machines like a facsimile apparatus and a copy machine in addition to the machine specialized in printing. Use of the liquid ejecting apparatus 10 of the invention is not limited to printing. For example, a liquid ejecting apparatus that ejects a solution of a coloring material is used as a manufacturing apparatus for forming a color filter of a liquid crystal display device, an organic electroluminescence (EL) display, a field emission display (FED), and the like. Further, a liquid ejecting apparatus that ejects a solution of a conductive material is used as a manufacturing apparatus for forming wirings and electrodes of the wiring substrate. It is also used as a chip manufacturing apparatus for ejecting a solution of bioorganic matter as a kind of liquid.

What is claimed is:

1. A liquid ejecting head comprising:
    a plurality of driving elements that cause a liquid to be ejected from a nozzle by fluctuating a pressure;
    a sealing body that forms a first space for accommodating the plurality of driving elements;
    a case member that forms a second space for surrounding the sealing body;
    a circuit substrate that drives the driving elements and is provided in the second space;
    an atmosphere vent that is formed in the case member and through which the second space communicates with atmosphere;
    a communication hole that is formed in the sealing body and through which the first space communicates with the second space; and
    a moisture absorbent that is provided in the second space and is not provided in the first space.

2. The liquid ejecting head according to claim 1,
    wherein the moisture absorbent is a solid and is positioned closer to the communication hole than to the atmosphere vent.

3. The liquid ejecting head according to claim 1,
    wherein the atmosphere vent is in a position higher than the communication hole in a vertical direction, and
    wherein the moisture absorbent is disposed between the atmosphere vent and the communication hole in the vertical direction.

4. The liquid ejecting head according to claim 1,
    wherein the second space includes a recess portion that has a bottom surface positioned lower than the communication hole in the vertical direction.

5. The liquid ejecting head according to claim 1,
    wherein the case member has a higher thermal conductivity than the sealing body.

6. The liquid ejecting head according to claim 1,
wherein the case member includes at least a lower case member and an upper case member which positioned at higher than the lower case member in the vertical direction,
wherein the moisture absorbent is disposed in the upper case member, and
wherein the lower case member has a higher thermal conductivity than the upper case member.

7. The liquid ejecting head according to claim 1,
wherein a minimum opening area of the communication hole is smaller than a minimum opening area of the atmosphere vent.

8. The liquid ejecting head according to claim 1,
wherein a volume of the first space is smaller than a volume of the second space.

9. The liquid ejecting head according to claim 1,
wherein a plurality of the sealing bodies are provided,
wherein the communication hole is provided corresponding to each of the sealing bodies, and
wherein the first space of each of the sealing bodies and the second space communicate with each other through each of the communication holes.

10. A liquid ejecting head according to claim 1, wherein the second space is formed of a single piece of the case member.

11. A liquid ejecting apparatus comprising:
a liquid ejecting head; and
a controller that is configured to control operation of ejecting liquid from the liquid ejecting head,
the liquid ejecting head comprising;
a sealing body that forms a first space for accommodating the plurality of driving elements;
a case member that forms a second space for surrounding the sealing body;
an atmosphere vent that is formed in the case member and through which the second space communicates with atmosphere;
a communication hole that is formed in the sealing body and through which the first space communicates with the second space; and
a moisture absorbent that is provided in the second space and is not provided in the first space.

12. A liquid ejecting apparatus according to claim 11,
wherein the moisture absorbent is a solid and is positioned closer to the communication hole than to the atmosphere vent.

13. A liquid ejecting apparatus according to claim 11,
wherein the atmosphere vent is in a position higher than the communication hole in a vertical direction, and
wherein the moisture absorbent is disposed between the atmosphere vent and the communication hole in the vertical direction.

14. A liquid ejecting apparatus according to claim 11,
wherein the second space includes a recess portion that has a bottom surface positioned lower than the communication hole in the vertical direction.

15. A liquid ejecting apparatus according to claim 11,
wherein the case member has a higher thermal conductivity than the sealing body.

16. A liquid ejecting apparatus according to claim 11,
wherein the case member includes at least a lower case member and an upper case member which positioned at higher than the lower case member in the vertical direction,
wherein the moisture absorbent is disposed in the upper case member, and
wherein the lower case member has a higher thermal conductivity than the upper case member.

17. A liquid ejecting apparatus according to claim 11,
wherein a minimum opening area of the communication hole is smaller than a minimum opening area of the atmosphere vent.

18. A liquid ejecting apparatus according to claim 11,
wherein a minimum opening area of the communication hole is smaller than a minimum opening area of the atmosphere vent.

19. A liquid ejecting apparatus according to claim 11,
wherein a plurality of the sealing bodies are provided,
wherein the communication hole is provided corresponding to each of the sealing bodies, and
wherein the first space of each of the sealing bodies and the second space communicate with each other through each of the communication holes.

20. A liquid ejecting apparatus according to claim 11, wherein the second space is formed of a single piece of the case member.

* * * * *